United States Patent
Ravnkilde et al.

(10) Patent No.: US 10,142,729 B2
(45) Date of Patent: Nov. 27, 2018

(54) MICROPHONE AND METHOD OF OPERATING A MICROPHONE

(71) Applicant: EPCOS AG, Munich (DE)

(72) Inventors: Jan Tue Ravnkilde, Hedehusene (DK); Christian Siegel, Tuntenhausen (DE); Matthias Jungkunz, München (DE); Gino Rocca, Copenhagen (DK); Ivan Riis Nielsen, Stenløse (DK); Anton Leidl, Hohenbrunn (DE); Pirmin Hermann Otto Rombach, Kongens Lyngby (DK)

(73) Assignee: TDK CORPORATION, Tokyo (JP)

( * ) Notice: Subject to any disclaimer, the term of this patent is extended or adjusted under 35 U.S.C. 154(b) by 10 days.

(21) Appl. No.: 15/312,633

(22) PCT Filed: May 20, 2014

(86) PCT No.: PCT/EP2014/060335
§ 371 (c)(1),
(2) Date: Nov. 19, 2016

(87) PCT Pub. No.: WO2015/176745
PCT Pub. Date: Nov. 26, 2015

(65) Prior Publication Data
US 2017/0150253 A1    May 25, 2017

(51) Int. Cl.
*H04R 3/00* (2006.01)
*H04R 3/04* (2006.01)
(Continued)

(52) U.S. Cl.
CPC ............ *H04R 3/002* (2013.01); *H03G 3/301* (2013.01); *H04R 3/04* (2013.01); *H04R 19/04* (2013.01)

(58) Field of Classification Search
CPC .......... H04R 3/002; H04R 3/007; H04R 3/04; H04R 19/04; H04R 19/005; H04R 19/016;
(Continued)

(56) References Cited

U.S. PATENT DOCUMENTS

| 5,870,482 A | 2/1999 | Loeppert et al. |
| 7,548,626 B2 | 6/2009 | Stenberg et al. |

(Continued)

FOREIGN PATENT DOCUMENTS

| EP | 1599067 B1 | 5/2013 |
| JP | 2009100459 A | 5/2009 |

(Continued)

*Primary Examiner* — Yogeshkumar Patel
(74) *Attorney, Agent, or Firm* — Slater Matsil, LLP

(57) ABSTRACT

A microphone and a method for operating a Microphone are disclosed. In an embodiment the microphone includes a transducer and a mode controller. The microphone has a normal operating mode ($M_O$) and a collapse mode ($M_1$). The mode controller switches to the collapse mode ($M_1$) when an output signal of the transducer reaches or exceeds a predefined threshold value and switches to the normal operating mode ($M_O$) when the output signal reaches or falls below a predefined further threshold value ($S_1$).

15 Claims, 5 Drawing Sheets

(51) Int. Cl.
*H03G 3/30* (2006.01)
*H04R 19/04* (2006.01)

(58) Field of Classification Search
CPC .. H04R 29/004; H04R 2201/003; H04R 1/08; H04R 17/02; H03G 3/301; B81C 99/0045
USPC ............ 381/113, 111, 174, 57, 92; 324/679; 73/9
See application file for complete search history.

(56) References Cited

U.S. PATENT DOCUMENTS

| | | |
|---|---|---|
| 8,223,981 B2 | 7/2012 | Haila et al. |
| 8,371,018 B2 | 2/2013 | Chang |
| 2006/0008097 A1* | 1/2006 | Stenberg ................ H04R 3/007 381/113 |
| 2009/0320557 A1* | 12/2009 | Sammoura .......... B81C 99/0045 73/9 |
| 2010/0013501 A1* | 1/2010 | Van Den Boom ....... G01D 3/08 324/679 |
| 2011/0110536 A1* | 5/2011 | Hovesten ............... H04R 19/04 381/111 |
| 2013/0294622 A1 | 11/2013 | Kasai et al. |

FOREIGN PATENT DOCUMENTS

| | | |
|---|---|---|
| JP | 2012191457 A | 10/2012 |
| WO | 2007132422 A1 | 11/2007 |
| WO | 2009127568 A1 | 10/2009 |
| WO | WO 2013/167183 * | 11/2013 |
| WO | 2014023363 A1 | 2/2014 |

\* cited by examiner

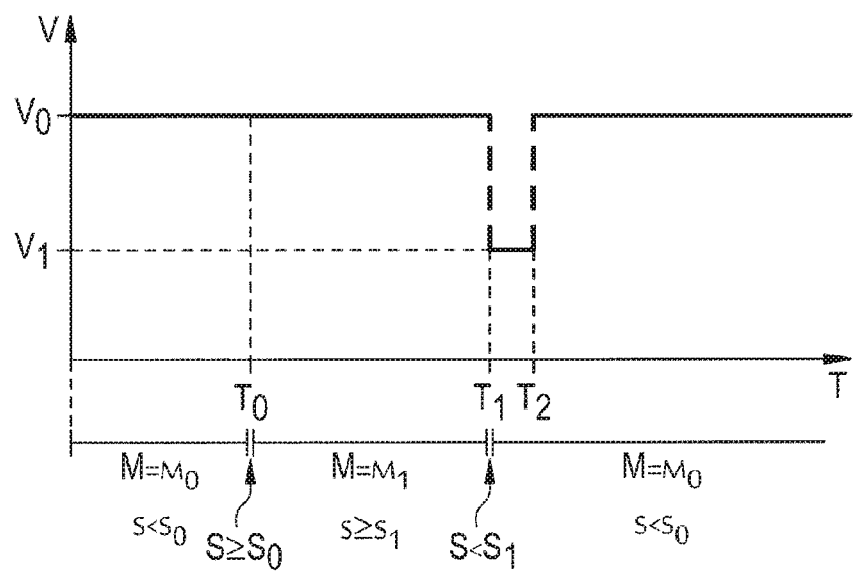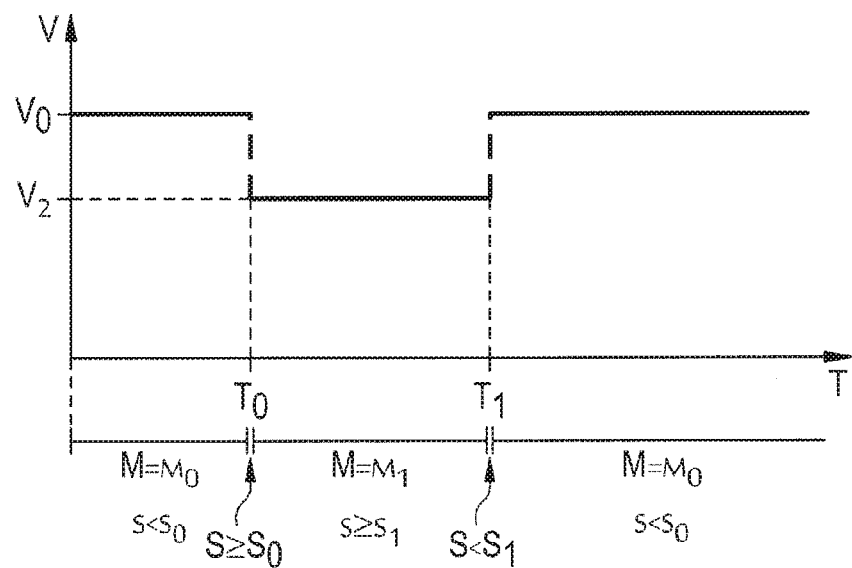

US 10,142,729 B2

MICROPHONE AND METHOD OF OPERATING A MICROPHONE

This patent application is a national phase filing under section 371 of PCT/EP2014/060335, filed May 20, 2014, which is incorporated herein by reference in its entirety.

TECHNICAL FIELD

The present disclosure relates to a microphone, in particular a condenser MEMS (Micro-Electrical-Mechanical Systems) microphone, and a method of operating a microphone. The microphone may comprise a single-ended or differential transducer. When the microphone is subjected to very high sound pressure levels, a collapse of the transducer may occur.

BACKGROUND

U.S. Pat. No. 5,870,482 discloses a miniature silicon condenser microphone wherein a movement of a diaphragm is limited for preventing a collapse. Patent application EP 1 599 067 A2 is directed to a method for detecting and controlling a diaphragm collapse in condenser microphones.

SUMMARY OF THE INVENTION

Embodiments of the invention provide a microphone with improved properties and an improved method for operating a microphone.

One aspect of the present disclosure relates to a microphone. The microphone comprises a transducer, in particular for converting an acoustical input signal into an electrical signal. The transducer may by manufactured by application of MEMS technology. The transducer may comprise a capacitor. In particular, an acoustical input signal may result in a change of capacitance of the transducer. Accordingly, the microphone may be a condenser or capacitor microphone. The transducer may comprise a diaphragm and one or more back-plates. In particular, the transducer may be a single-ended or differential transducer.

The microphone may comprise a voltage supply for the transducer. Thereby, a bias voltage can be applied to the transducer, in particular between the diaphragm and one or more back-plates of the transducer. By adjusting the value of the bias voltage the sensitivity of the transducer may be adjusted. The voltage supply may comprise a voltage generator, in particular a charge pump.

By an acoustical input, in particular a pressure wave, the diaphragm may be deflected such that the distance between the diaphragm and the back-plate changes, resulting in a change of capacitance of the transducer. When the microphone is subjected to very high sound pressure levels (SPL), a collapse of the diaphragm may occur. In particular, the diaphragm may contact the back-plate and, due to the electrical field between the diaphragm and the back-plate, stick to the back-plate.

The microphone may have a normal operating mode and a collapse mode. The microphone may comprise a mode controller.

The mode controller may monitor the output signal of the transducer, in particular continuously monitor the output signal. The mode controller may switch to the collapse mode when an output signal of the transducer reaches or exceeds a predefined threshold value. Furthermore, the mode controller may switch to the normal operating mode when the output signal reaches or falls below a predefined further threshold value. The respective output signal may be an unprocessed signal generated by the transducer. Alternatively, the respective output signal may have be processed before being compared to the threshold values. As an example, the output signal may have been amplified.

The mode controller may be a part of an electronic circuit, in particular an electronic circuit fabricated as an ASIC (application-specific electronic circuit). As an example, the microphone assembly may comprise a MEMS die comprising the transducer and an ASIC die comprising the electronic circuit electrically connected to the MEMS die.

The output signal reaching or exceeding the predefined threshold value may indicate that a collapse of the diaphragm has occurred or that a collapse is imminent. Switching to the collapse mode may imply setting an internal flag. The mode controller may be adjusted to trigger switching further parts of the electronic circuit into a collapse mode. As an example, the processing of the output signal of the transducer may be changed in the collapse mode. Switching to the collapse mode may imply the adjustment of parameters, for example the gain of an amplifier. Additionally or alternatively, parameters of the transducer may be adjusted, for example the bias voltage applied to the transducer.

The output signal reaching or falling below the further predefined threshold value may indicate that a high SPL event has ended. The mode controller may be adjusted to trigger switching further parts of the electronic circuit into a normal operating mode.

In an embodiment, the microphone may be configured such that the bias voltage is decreased when the microphone switches to the collapse mode. As an example, in the normal operating mode, an operating voltage may be provided to the transducer. In the collapse mode, the level of the bias voltage may be lowered such that the diaphragm is enabled to release from the back-plate. If a collapse has not yet occurred, an imminent collapse of the diaphragm may be prevented by reducing the bias voltage.

In an embodiment, the microphone may be configured such that the level of the bias voltage is maintained when the microphone switches to the collapse mode. The level may be maintained at the normal operating voltage during the persistence of the collapse mode. In this embodiment, a collapse of the diaphragm may be maintained during the collapse mode.

The microphone may be configured such that when the microphone switches from the collapse mode to the normal operating mode, the level of the bias voltage is first decreased and then increased again. In particular, the level of the bias voltage may be first set below the operating voltage in order to enable a release of the diaphragm from the back-plate. Then, the level of the bias voltage may be set to the operating voltage again. This mode of operation enables a release of the collapse also when the operating voltage is maintained in the collapse mode. However, this mode of operation may also be useful when the voltage is reduced in the collapse mode. In particular, a release of the diaphragm may be ensured.

By monitoring the output signal of the transducer and the switching back to the normal operating mode only if the current signal is below the further threshold value, it may be ensured that the high SPL event has ended before the microphone returns to the normal operating mode. Thereby, a permanent collapse may be prevented.

The microphone may be configured to switch from the collapse mode to the normal operating mode only if the output signal has remained equal to or below the further threshold value at least during a predefined amount of time.

As an example, the predefined amount of time may be at least 200 ms. In particular, the predefined amount of time may be 400 ms or longer.

In the collapse mode, the sensitivity of the microphone may be smaller than in the normal operating mode. In particular, the sensitivity of the transducer may be smaller than in the normal operating mode. A loss of sensitivity may result from a reduction of the bias voltage during the collapse mode. Alternatively or additionally, a loss of sensitivity may result from the diaphragm sticking to a back-plate. This may be particularly the case when the bias voltage is not reduced during the collapse mode. As an example, the sensitivity may be reduced by 5 dB to 25 dB, in particular by 10 dB to 20 dB. A reduced sensitivity may enable a microphone output with a low signal level during a high SPL event. The output signal may be processed further into a low sound output when a loudspeaker is provided. Accordingly, a user may be provided with a low volume output during one or multiple high SPL events.

The threshold value may be higher than the further threshold value. The difference in the threshold values may reflect the difference in the sensitivity of the transducer. As an example, the threshold value may be higher by 5 dB to 25 dB, in particular by 10 dB to 20 dB, than the further threshold value. The threshold value may correspond to a range of 120 to 140 dB SPL. The further threshold value may correspond to a range of 100 to 130 dB SPL.

In an embodiment, the microphone comprises an amplifier and a gain controller for adjusting the gain of the amplifier. In particular, the microphone may comprise one or more amplifiers. Accordingly, the sensitivity of the microphone may be adjustable. In particular, the microphone may be configured to adjust the gain of the amplifier in the collapse mode.

This may be useful in applications where a sensitivity loss of the transducer in the collapse mode is unwanted. In particular, a sensitivity loss of the transducer in the collapse mode may be fully or partly compensated by the amplifier, wherein the compensation may be triggered by the gain controller.

In an embodiment, the microphone comprises an analogue-to-digital (A/D) converter for providing a digital output of the microphone. A signal generated by the transducer may be first processed by an amplifier and then fed into the A/D converter. The amplifier may have an adjustable gain, wherein the gain setting is controlled by the gain controller. Furthermore, the microphone may comprise a digital converter. The digital converter may have an adjustable gain, wherein the gain setting is also controlled by the gain controller. The gain controller may be configured to adjust the gain of the digital converter and the amplifier. Thereby, a sensitivity loss of the transducer in the collapse mode may be compensated.

In an embodiment, the microphone may comprise a pre-amplifier and an amplifier for processing the signal generated by the transducer. The gain of the pre-amplifier and/or of the amplifier may be adjustable by the gain controller in order to compensate a loss of sensitivity in the collapse mode.

A further aspect of the present disclosure relates to a method of operating a microphone, in particular the microphone as described above. Features described with respect to the microphone are also disclosed herein with respect to the method and vice versa, even if the respective feature is not explicitly mentioned in the context of the specific aspect.

The method comprises the step of operating the microphone in the normal operating mode. As an example, the transducer is provided with a bias voltage at an operating level. In a further step, the microphone is switched into the collapse mode when an output signal of the transducer reaches or exceeds a predefined threshold value. In the collapse mode, the bias voltage may be reduced. Alternatively, the bias voltage may be maintained. In a further step, the microphone is switched into the normal operating mode when the output signal reaches or goes below a predefined further threshold value.

BRIEF DESCRIPTION OF THE DRAWINGS

Further features, refinements and expediencies become apparent from the following description of the exemplary embodiments in connection with the figures.

FIG. 3 shows a schematic diagram of a bias voltage as a function of time according to a first embodiment, FIG. 4 shows a schematic diagram of a bias voltage as a function of time according to a second embodiment.

Like elements, elements of the same kind and identically acting elements may be provided with the same reference numerals in the figures.

DETAILED DESCRIPTION OF ILLUSTRATIVE EMBODIMENTS

Figure 1:
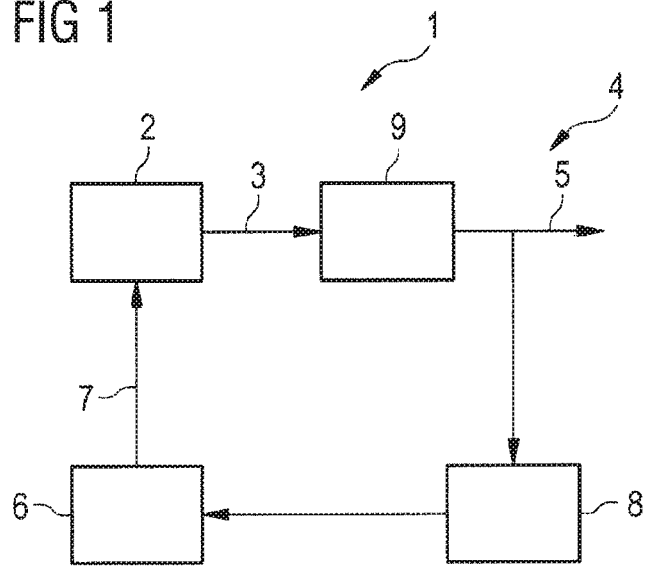
FIG. 1 shows a simplified diagram illustrating an embodiment of a microphone assembly.

FIG. 1 shows a schematic diagram of an embodiment of a microphone 1. The microphone 1 is a condenser microphone. The microphone 1 comprises a transducer 2 for converting an acoustical input signal into an electrical signal. The transducer 2 is a MEMS transducer. As an example, the transducer 2 may comprise a semiconductor material such as silicon or gallium arsenide. The transducer 2 comprises a diaphragm and one or more back-plates. As an example, the distance between the diaphragm and back-plate may be in a range of 1 µm to 10 µm. In particular, the transducer 2 may be configured as a differential transducer or as a single-ended transducer. On an acoustical input signal, the diaphragm is deflected towards a back-plate, whereby the capacitance of the transducer 2 changes, which results in an electrical signal at an input 3 of an electronic circuit 4 of the microphone.

The electronic circuit 4 comprises a voltage supply 6 for providing the transducer 2 with a bias voltage via a bias line 7, in particular with a DC bias voltage. The voltage supply 6 may comprise a charge pump, for example a Dickson charge pump. As an example, the bias voltage may be in the range of 8 V to 15 V.

The electronic circuit 4 may comprise elements further processing the electrical signal generated by the transducer. In particular, the electronic circuit 4 may comprise an amplifier 9. The amplifier 9 may adjust the signal level and/or may transform a high impedance electrical signal of the transducer 2 into a low impedance signal. The microphone 1 comprises an output 5, which may be an analogue or digital output.

The electronic circuit 4 comprises a mode controller 8 for setting a mode of the microphone 1. The mode controller 8 monitors the electrical signal generated by the transducer 2. Depending on the signal level, the mode controller 8 switches the microphone 1, and in particular the voltage supply 6, from a normal operating mode into a collapse mode and vice versa. Switching the mode may imply setting an internal flag of the mode controller 8. Accordingly also the mode of the mode controller 8 switches. In the normal operating mode, the voltage supply 6 supplies the transducer 2 with the operating bias voltage $V_O$. When the electrical mode monitored by the mode controller 8 reaches or exceeds a predefined threshold value, the voltage supply 6 switches into the collapse mode. The electronic circuit 4 may comprise further parts not depicted in FIG. 1. As an example, the signal generated by the mode controller 8 may be further processed before being fed into the voltage supply 6.

The electrical signal exceeding the threshold value may indicate that a collapse of the transducer 2 has occurred or is imminent. In a collapse, the diaphragm of the transducer 2 contacts the back-plate. As an example, the microphone 1 may exhibit a collapse for short SPL of 145 dB. This may result in a large change of capacitance. Due to the electrical field present between the diaphragm and the back-plate, the diaphragm may stick to the back-plate and the transducer 2 may remain in the collapsed state until the bias voltage is sufficiently reduced.

Figure 2:
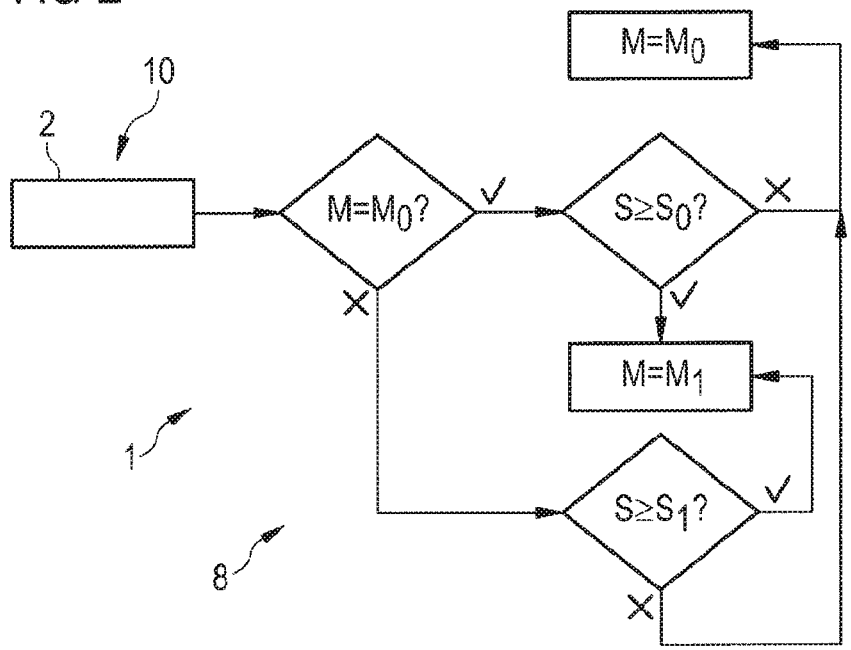
FIG. 2 shows a schematic flow diagram of an embodiment of operating a microphone.

Details of operating the microphone 1 are illustrated in FIG. 2.

FIG. 2 shows a schematic flow diagram of an embodiment of operating a microphone, in particular of setting a mode of the microphone.

Initially, the microphone 1 is in the normal operating mode $M_O$, in which the voltage supply supplies an operating voltage $V_O$. On an acoustical input 10, the transducer 2 generates an electrical signal which is fed into the mode controller 8. The electrical signal may be further processed before being fed into the mode controller 8, for example amplified by an amplifier 9 as shown in FIG. 1. Depending on the value of the current mode M, as indicated by the query "$M=M_O$", the electrical input signal is further processed by the mode controller 8. When the microphone is in the normal operating mode $M_O$, as indicated by "✓", the mode controller 8 compares the value of the input signal S with a predefined threshold value $S_O$, as indicated by the query "$S>=S_O$?". As an example, the threshold value may correspond to a sound pressure level of 130 dB SPL. In the case that the signal level S is below the threshold value $S_O$, i.e. $S<S_O$, as indicated by "x", the normal operating mode $M_O$ is maintained, as indicated by "$M=M_O$".

If the signal level S reaches or exceeds the threshold value $S_O$, i.e. $S>=S_O$, as indicated by "✓", the microphone switches into the collapse mode $M_1$, as indicated by "$M=M_1$". In particular, the mode controller 8 generates a signal indicative for the collapse mode $M_1$, thereby changing the operation mode of further parts of the electronic circuit, for example of the voltage supply 6.

After that, the mode controlling routine starts again. The electrical signal generated by the transducer 2 is analysed by the mode controller 8. When the microphone is in the collapse mode, i.e. $M \neq M_O$, as indicated by "x", the mode controller 8 decides if the collapse mode $M_1$ is maintained or if the microphone switches back into the normal mode $M_O$. For that purpose, the current signal level is compared with a further threshold value $S_1$.

The further threshold level $S_1$ may be lower than the threshold level $S_O$. In the collapsed state, the sensitivity of the transducer may be reduced, for example by about 15 dB to 20 dB. Therefore, the electrical signal generated by the transducer may have a lower level at a specific sound pressure level than in the non-collapsed state. As an example, the threshold level $S_1$ may be lower by 10 dB to 20 dB than the threshold level $S_O$. As an example, the further threshold value may correspond to an acoustical input of 110 dB SPL.

If the signal level reaches or exceeds the further threshold value $S_1$, i.e. $S>=S_1$, as indicated by "✓", the collapse mode $M_1$ is maintained, as indicated by "$M=M_1$". If the signal level is below the further threshold value $S_1$, i.e. $S<S_1$, as indicated by "x", the microphone switches back into the normal mode $M_O$, as indicated by "$M=M_O$".

In the shown embodiment, the condition for switching the mode is a signal level reaching or exceeding the threshold level or is a signal level reaching or falling below the further threshold level. This may mean that the signal reaching one of the threshold level may be sufficient for switching the mode. Alternatively, the signal has to exceed the threshold level or fall below the further threshold level for switching the mode.

In an embodiment, the microphone may switch only back into the normal mode $M_O$ if the signal level is below the further threshold value $S_1$ for a predefined amount of time. As an example, a condition for going back to the normal mode may be that the signal level is below the further threshold value for more than 500 ms. By this condition, the microphone may remain in the collapse mode during repetitive high SPL events or during a low frequency high SPL event. This may help to avoid an unpleasant high output of the microphone and, in particular, an unpleasant sound in an additional loudspeaker, in an ongoing high SPL event.

FIG. 3 shows a schematic diagram of a bias voltage V as a function of time T during a collapse event according to a first embodiment.

Initially, the microphone is in the normal operating mode $M_O$, in which the voltage supply supplies an operating voltage $V_O$. The signal level S is below the threshold value $S_O$. At a time $T_O$ the mode controller detects that the signal level S has reached or exceeded the threshold value $S_O$ and, accordingly, switches to the collapse mode $M_1$.

In this embodiment, the bias voltage is maintained at the value $V_O$ in the collapse mode. Due to the high bias voltage, the diaphragm may remain in the collapsed state. In this state, the diaphragm deflection is limited to the non-collapsed parts of the diaphragm. This will lower the electrical signal of the transducer as compared to a non-collapsed state, for example by 10 dB to 20 dB, depending on the diaphragm design.

The mode controller continuously checks the signal level. As long as the signal reaches or exceeds a further threshold level $S_1$, the collapse mode $M_1$ is maintained.

At time $T_1$, the signal level has fallen below the further threshold level $S_1$ and the microphone switches back to the normal mode $M_O$. At this time, the bias voltage is lowered to a value $V_1$, which is below a diaphragm release voltage such that the diaphragm releases from the back-plate. The value $V_1$ may be maintained for 100 ms, for example. At time $T_2$ the bias voltage is set back to the normal operating voltage $V_O$.

As has been discussed already in connection with FIG. 2, the microphone may be configured such that the mode is only switched back to the normal mode when the signal level is below the further threshold level $S_1$ for at least a predefined amount of time. As an example, if the signal level is below the further threshold level $S_1$ at a specific time and above the threshold level at the next point of measurement, the collapse mode and therewith the operating voltage may be maintained.

Due to the continuous monitoring of the electrical signal, the operating mode of the microphone can be set as a function of the current sound pressure level. When the microphone is in the collapse mode, a signal level equal or above the further threshold level $S_1$ is an indication for an ongoing high SPL event. In particular, repetitive high SPL events or a low frequency high SPL event may occur. The microphone may be only switched back to the normal mode when the high SPL event has ended. This may ensure that the diaphragm actually releases from the back-plate when the voltage is set below the release voltage and that the diaphragm is not still pressed to the back-plate due to an ongoing high SPL event. Thus, a permanent collapse in case of a long or repetitive SPL event can be avoided.

Furthermore, due to the reduced sensitivity of the microphone in the collapse mode, an output of the microphone is kept at a low signal level even throughout one or multiple high SPL events. As the voltage is kept at the level of the operating voltage $V_O$, the diaphragm is enabled to remain in the collapsed state during the collapse mode. The low electrical signal may be processed further into a low sound output when a loudspeaker is provided. Accordingly, a user may be provided with a low volume output during one or multiple high SPL events.

FIG. 4 shows a schematic diagram of a bias voltage as a function of time during a collapse event according to a second embodiment.

Initially, the microphone is in the normal operating mode $M_O$, in which the voltage supply supplies an operating voltage $V_O$. At a time $T_O$ the mode controller detects that the signal level S has reached or exceeded the threshold value $S_O$ and the mode is switched to the collapse mode $M_1$.

In this embodiment, when the mode is switched to the collapse mode, the bias voltage is lowered to a level $V_2$. The value of $V_2$ is below a diaphragm release voltage such that the diaphragm is enabled to release from the back-plate. The value of $V_2$ may be higher than the value of $V_1$ of FIG. 3. Preferably, the value of $V_2$ is significantly smaller than the value of the operating voltage $V_O$. As an example, the value of $V_2$ may be in a range of 1 V to 4 V. The value of $V_O$ may be in a range of 8 V to 15 V. As an example, due to the lower bias voltage, the output signal may be reduced by 10 dB to 20 dB compared to the output signal at normal bias voltage.

Ongoing high SPL events or a low frequency high SPL event may press the diaphragm again to the back-plate in the collapse mode. However, as the bias voltage is below the diaphragm release voltage, the diaphragm again releases from the back-plate once the high SPL event has ended. Due to the lower bias voltage, the output signal is kept at a tolerable level also at further high SPL events.

The mode controller continuously monitors the signal level. As long as the signal level reaches or exceeds the further threshold level $S_1$, the collapse mode $M_1$ is maintained.

At time $T_1$ the signal level falls below the further threshold level $S_1$ and the microphone switches back to the normal mode $M_O$. At this time, the bias voltage is increased to the normal operating voltage $V_O$.

As explained with reference to FIG. 3, also in the second embodiment shown in FIG. 4, the microphone signal stays in a linear region throughout a high SPL event. This enables to provide a user with a low volume output during a high SPL event and, in particular during a series of shortly following high SPL events. In particular, a nice sound output may be given even under extremely high sound pressure level conditions.

Furthermore, due to the monitoring of the signal, the microphone is enabled to be reset to the normal mode only if the high SPL event causing the collapse has ended. In particular, as explained in connection with FIG. 3, also in the embodiment of FIG. 4 it may be requested that the signal level is below the further threshold value for a predefined amount of time before the mode is switched back from the collapse mode to the normal mode. Thereby, a permanent collapse, in particular due to an ongoing collapse event during switching back to the normal mode, can be avoided.

In some applications, a reduction of sensitivity during a high SPL event may not be desirable. In this case, a sensitivity compensation may be applied.

Figure 5:
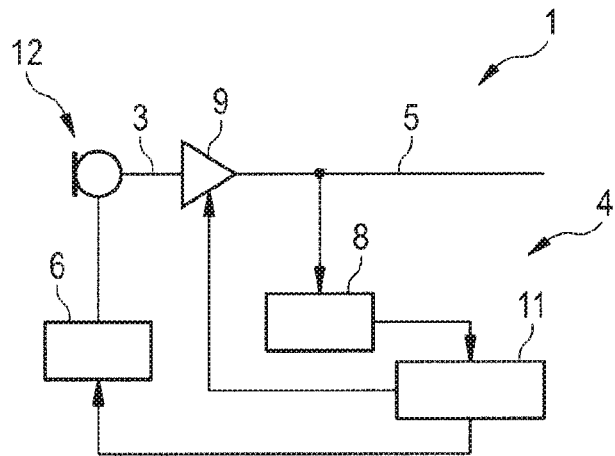
FIG. 5 shows a schematic diagram of a microphone with a single-ended transducer and sensitivity compensation according to an embodiment.

FIG. 5 shows a schematic diagram of a microphone with sensitivity compensation according to a first embodiment.

The electronic circuit 4 comprises a gain controller 11 for compensating a loss of sensitivity when the microphone 1 is in the collapse mode. A loss of sensitivity may result from a reduction of the bias voltage during the collapse mode as explained with reference to FIG. 4. Alternatively or additionally, a loss of sensitivity may result from the diaphragm sticking to a back-plate. This may be the case during the collapse mode when the bias voltage is not reduced as explained with reference to FIG. 3.

The microphone 1 comprises a single-ended transducer 12. In particular, the single-ended transducer 12 comprises a condenser with a single back-plate. The output signal of the single-ended transducer 12 results from the change of capacitance of the condenser. The signal generated by the single-ended transducer 12 is processed by an amplifier 9 and fed into a mode controller 8, as already described with reference to FIGS. 1 and 2. The mode controller 8 provides a signal to the gain controller 11. The signal is indicative for the current mode of the microphone 1.

Depending on the current mode, the gain controller 11 adjusts the gain of the amplifier 9. In particular, the gain controller 11 may adjust the gain of the amplifier 9 and, thereby, the sensitivity of the microphone such that the sensitivity loss resulting from the reduced voltage is compensated.

The gain controller 11 also adjusts the level of the bias voltage generated by the voltage supply 6. In particular, when the mode controller 8 generates a signal indicating a switch to the collapse mode, the gain controller 11 triggers a reduction of the bias voltage by an amount of $\Delta V$.

When the mode controller 8 generates a signal triggering switching back to the normal mode, the gain controller 11 triggers an increase of the bias voltage by an amount of $\Delta V$, i.e. back towards the operating voltage $V_O$, and simultaneously adjusts the gain of the amplifier 9 and, thereby, the sensitivity of the microphone 1 back to the initial value at normal mode.

The microphone shown in FIG. 5 may be an analogue output microphone. For an analogue output microphone, a full compensation may not be possible, as the voltage range of the analogue output may be limited. In a further embodiment, the microphone may be a digital output microphone, comprising converter elements as is described in connection with FIG. 7, for example.

Figure 6:
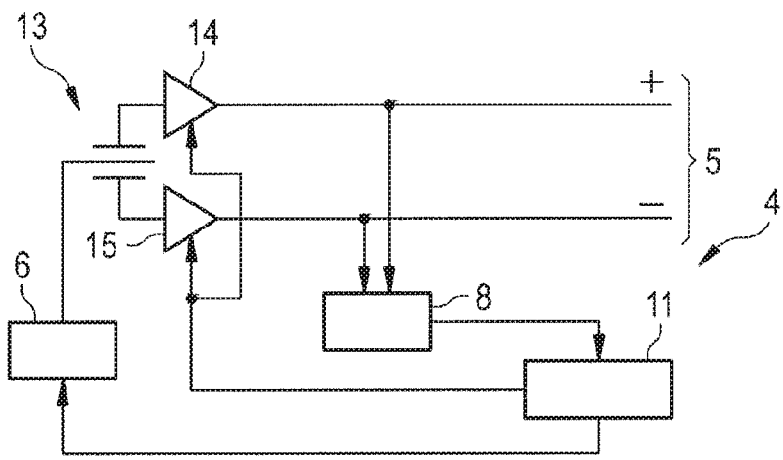
FIG. 6 shows a schematic diagram of a microphone with a differential transducer and sensitivity compensation according to an embodiment.

FIG. 6 shows a schematic diagram of a microphone with sensitivity compensation according to a second embodiment.

The microphone 1 comprises a differential transducer 13 with a diaphragm arranged between two back-plates. Accordingly, the transducer 13 comprises a first condenser provided by the diaphragm and a first back-plate and comprises a second condenser provided by the diaphragm and a second back-plate. A first signal of the transducer 13 reflects the change of capacitance of the first condenser and a second signal reflects the change of capacitance of the second condenser. The first signal is processed by a first amplifier 14 and the second signal is processed by a second amplifier 15. Both amplifiers are variable.

A mode controller 8 receives the signals provided by the first and second amplifiers 14, 15 and generates a signal indicative of the current mode, which is fed into a gain controller 11. The gain controller 11 adjusts the gain of the first and second amplifiers 14, 15 and the level of the bias voltage generated by the voltage supply 6 as described with reference to FIG. 5.

The microphone shown in FIG. 6 may be an analogue output microphone. In a further embodiment, the microphone may be a digital output microphone, comprising converter elements as is described in connection with FIG. 8, for example.

Figure 7:
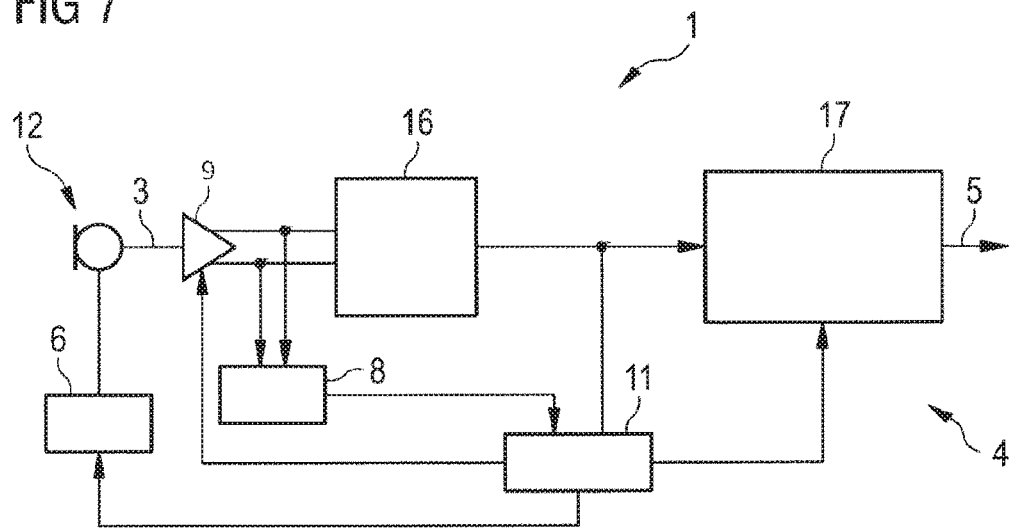
FIG. 7 shows a schematic diagram of a microphone with a single-ended transducer and sensitivity compensation according to an embodiment.

FIG. 7 shows a schematic diagram of a microphone 1 with sensitivity compensation according to the first embodiment as shown in FIG. 5 and further providing a digital output 5.

The analogue output signal provided by the amplifier 9 is fed into an analogue-to-digital (A/D) converter 16, which converts the analogue input signal into a digital output signal. The A/D converter 16 may be configured as an analogue-to-digital sigma-delta modulator.

The digital signal is fed into a digital converter 17 having an adjustable gain setting. The digital converter 17 may be adapted to convert a multi-bit digital signal into a single-bit digital signal.

In the normal mode, the gain controller 11 may set the gain of the amplifier 9 and the digital converter 17 such that the product of the gain settings remains constant. As an example, the gain controller 11 may monitor an output signal of the analogue converter 16. If the signal level exceeds a certain value, the gain controller 11 may decrease the gain setting of the amplifier 9 such that an overflow of the A/D converter 16 can be avoided. Simultaneously, the gain controller 11 may increase the gain setting of the digital converter 17 such that the overall gain remains constant. Accordingly, a change of the gain of the amplifier in the analogue domain is compensated by a change of the gain in the digital domain.

In the collapse mode, the gain controller 11 adjusts the gain of the amplifier 9 and the digital converter 17 such that the sensitivity loss resulting from the reduced voltage is compensated. Also here, the product of the gain settings may remain constant during the collapse mode.

Figure 8:
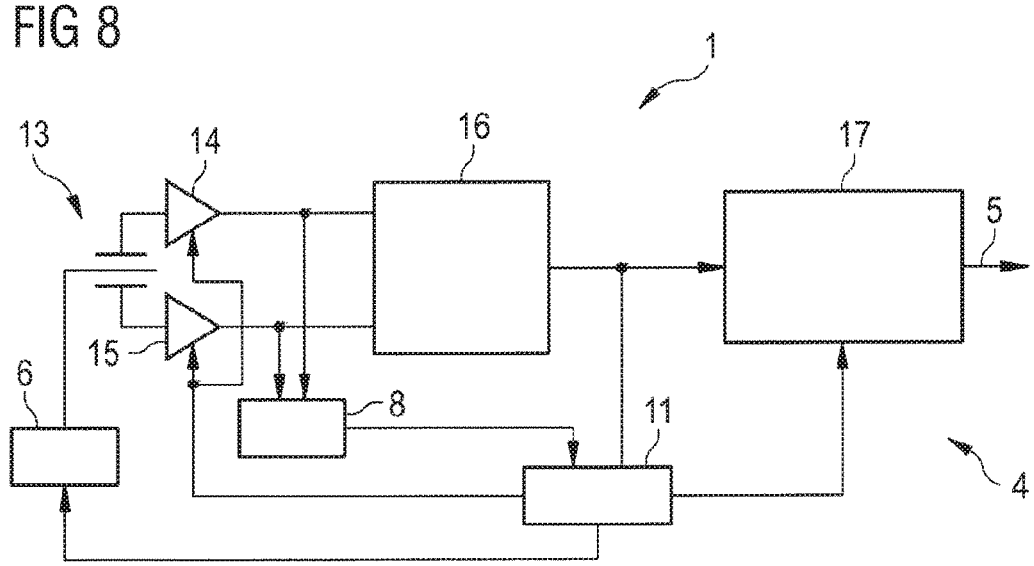
FIG. 8 shows a schematic diagram of a microphone with a differential transducer and sensitivity compensation according to an embodiment.

FIG. 8 shows a schematic diagram of a microphone 1 with sensitivity compensation according to the second embodiment as shown in FIG. 6 and further providing a digital output 5. The microphone 1 comprises an A/D converter 16 and a digital converter 17 with structural and functional characteristics as discussed with reference to FIG. 7.

Figure 9:
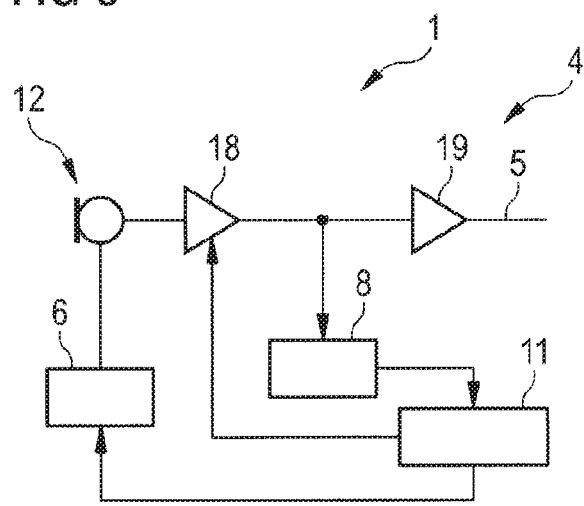
FIG. 9 shows a schematic diagram of a microphone with a single-ended transducer and sensitivity compensation according to an embodiment.

FIG. 9 shows a schematic diagram of a microphone 1 with sensitivity compensation similar to the embodiment as shown in FIG. 5.

However, in the present embodiment, the microphone 1 comprises a pre-amplifier 18 with adjustable gain and an amplifier 19. The signal generated by the single-ended transducer 12 is fed into the variable pre-amplifier 18. The adjustment of the gain corresponds to the adjustment as described in connection with FIG. 5. The signal processed by the pre-amplifier 18 is further processed by an amplifier 19 and provided at an output 5 of the microphone 1.

Figure 10:
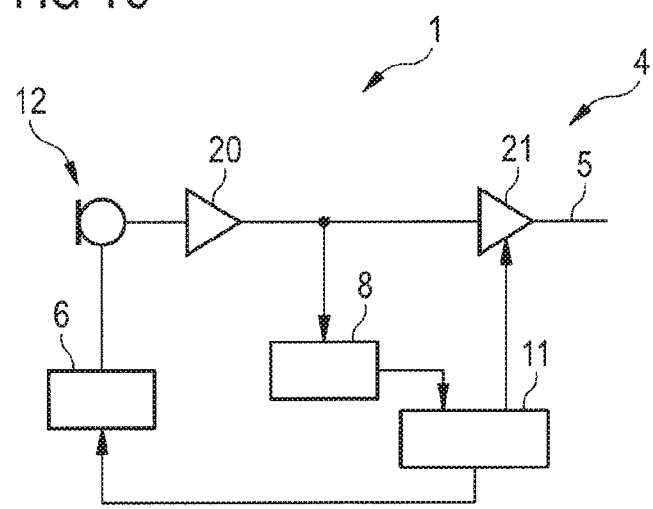
FIG. 10 shows a schematic diagram of a microphone with a single-ended transducer and sensitivity compensation according to an embodiment.

FIG. 10 shows a schematic diagram of a microphone 1 with sensitivity compensation similar to the embodiment as shown in FIG. 9.

However, in this embodiment, the signal is fed into a non-variable pre-amplifier 20 and further processed by an amplifier 21 with adjustable gain. The adjustment of the gain corresponds to the adjustment as described in connection with FIG. 5.

The invention claimed is:

1. A microphone comprising:
   a transducer; and
   a mode controller for switching between a normal operating mode ($M_O$) and a collapse mode ($M_1$),
   wherein the mode controller is configured to monitor an output signal of the transducer and switches to the collapse mode ($M_1$) when the output signal of the transducer reaches or exceeds a predefined first threshold value ($S_O$), and switches to the normal operating mode ($M_O$) when and only when the output signal (S) reaches or falls below a predefined second threshold value ($S_1$).

2. The microphone of claim 1, further comprising a voltage supply for supplying the transducer with a bias voltage, wherein when the microphone switches to the collapse mode ($M_1$) the bias voltage is decreased.

3. The microphone of claim 1, further comprising a voltage supply for supplying the transducer with a bias voltage, wherein when the microphone switches to the collapse mode ($M_1$) the bias voltage is maintained.

4. The microphone of claim 1, wherein, when the microphone switches from the collapse mode ($M_1$) to the normal operating mode ($M_O$), a bias voltage is first decreased and then increased.

5. The microphone of claim 1, wherein the microphone is adapted to switch from the collapse mode ($M_1$) to the normal operating mode ($M_O$) only if the output signal has remained equal to or below the second threshold value ($S_1$) at least during a predefined amount of time.

6. The microphone of claim 5, wherein the predefined amount of time is longer than 400 ms.

7. The microphone of claim 1, wherein the first threshold value ($S_O$) is higher than the second threshold value ($S_1$).

8. The microphone of claim 1, wherein the first threshold value ($S_O$) is in a range between 120 and 140 dB SPL.

9. The microphone of claim 8, wherein the second threshold value ($S_1$) is in a range between 100 and 130 dB SPL.

10. The microphone of claim 1, wherein, in the collapse mode ($M_1$), a sensitivity of the microphone is smaller than a sensitivity if the microphone in the normal operating mode ($M_O$).

11. The microphone of claim 1, further comprising an amplifier and a gain controller for adjusting a gain of the amplifier.

12. The microphone of claim 11, wherein a sensitivity loss of the transducer in the collapse mode ($M_1$) is compensated by the amplifier.

13. The microphone of claim 11, further comprising a digital converter, wherein the gain controller is adapted to adjust a gain of the digital converter.

14. The microphone of claim 11, further comprising a pre-amplifier, wherein the gain controller is adapted to adjust the gain of at least one of the pre-amplifier and the amplifier.

15. A method for operating a microphone, the method comprising:
   operating the microphone in a normal operating mode ($M_O$);
   monitoring an output signal of a transducer;
   switching into a collapse mode ($M_1$) when the output signal of the transducer reaches or exceeds a predefined first threshold value ($S_O$); and
   switching into a normal operating mode ($M_O$) when and only when the output signal reaches or drops below a predefined second threshold value ($S_1$).

* * * * *